US010865476B2

(12) United States Patent
Chen et al.

(10) Patent No.: US 10,865,476 B2
(45) Date of Patent: Dec. 15, 2020

(54) CONTROL AND CHARACTERIZATION OF TEXTURE IN CVD α-AL$_2$O$_3$ COATINGS

(71) Applicant: Kennametal Inc., Latrobe, PA (US)

(72) Inventors: Chen Chen, Latrobe, PA (US); Zhenyu Liu, Greensburg, PA (US); Peter Rudolf Leicht, Latrobe, PA (US); Rodrigo Alejandro Cooper, Houston, TX (US)

(73) Assignee: KENNAMETAL INC., Latrobe, PA (US)

( * ) Notice: Subject to any disclaimer, the term of this patent is extended or adjusted under 35 U.S.C. 154(b) by 177 days.

(21) Appl. No.: 15/926,504

(22) Filed: Mar. 20, 2018

(65) Prior Publication Data
US 2018/0274091 A1 Sep. 27, 2018

Related U.S. Application Data

(60) Provisional application No. 62/475,699, filed on Mar. 23, 2017.

(51) Int. Cl.
C23C 16/40 (2006.01)
C23C 16/02 (2006.01)
C23C 16/52 (2006.01)

(52) U.S. Cl.
CPC ........ C23C 16/403 (2013.01); C23C 16/0272 (2013.01); C23C 16/52 (2013.01)

(58) Field of Classification Search
USPC ........................................ 428/336, 701, 702
See application file for complete search history.

(56) References Cited

U.S. PATENT DOCUMENTS

2008/0187774 A1* 8/2008 Ruppi .................... C22C 29/08
  428/627
2012/0015148 A1* 1/2012 Ruppi .................... C23C 16/36
  428/148
(Continued)

FOREIGN PATENT DOCUMENTS

CN    102061454    *  5/2011
EP    2902528      *  8/2015
WO    2015/114049  *  8/2015

Primary Examiner — Archene A Turner
(74) Attorney, Agent, or Firm — Larry R. Meenan

(57) ABSTRACT

CVD Alumina coating has been one of the most important materials for wear resistant application for many years. Recently, texture control in α-Al$_2$O$_3$ has attracted increasing attention due to the possibility to further improve the anisotropic properties such as thermal conductivity and mechanical properties. The influence of process parameters on textures is complex. In the present application, the influence of nucleation surface condition and H$_2$S on the texture in CVD α-Al$_2$O$_3$ coatings has been investigated. It has been shown that without the addition of H$_2$S, the crystal orientation in the Al$_2$O$_3$ coatings is primarily dominated by the nucleation surface condition, whereas the effect of reactant composition on texture is minimal. On the other hand, in the presence of H$_2$S during growth, reactant composition also plays an important role in affecting the crystal orientation. This effect is likely due to the strong interaction between the Al$_2$O$_3$ surface and the H$_2$S.

15 Claims, 5 Drawing Sheets

(56) References Cited

U.S. PATENT DOCUMENTS

| | | | |
|---|---|---|---|
| 2013/0212953 A1* | 8/2013 | Johansson | B23B 27/148 51/309 |
| 2014/0193622 A1* | 7/2014 | Stiens | C23C 30/005 428/216 |
| 2014/0193624 A1* | 7/2014 | Stiens | C23C 30/005 428/216 |
| 2014/0377024 A1* | 12/2014 | Sobana | C23C 16/36 407/119 |
| 2015/0003925 A1* | 1/2015 | Ostlund | C23C 30/005 407/119 |

* cited by examiner

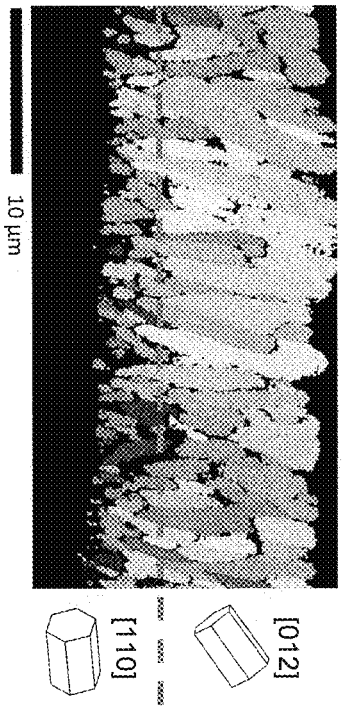
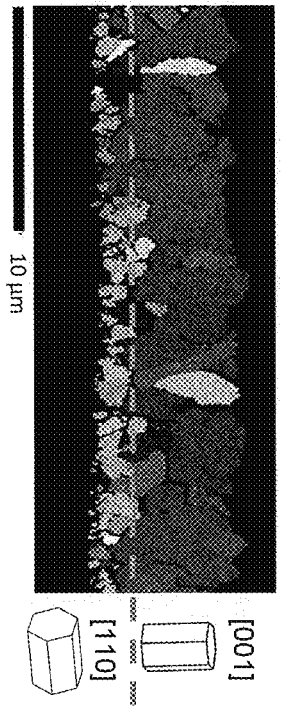
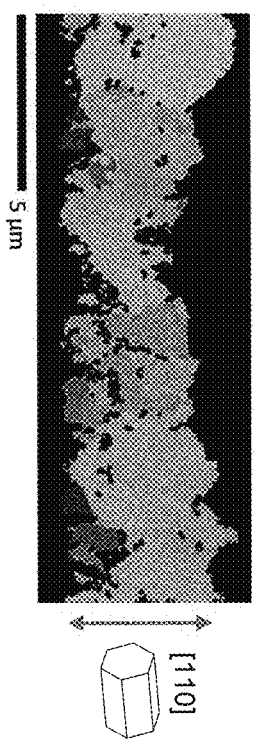
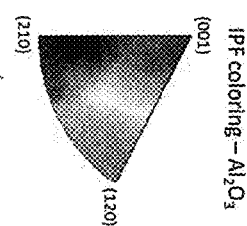
FIG. 3(A)    FIG. 3(B)    FIG. 3(C)
Growth Direction

CONTROL AND CHARACTERIZATION OF TEXTURE IN CVD α-AL₂O₃ COATINGS

RELATED APPLICATION DATA

The present application claims priority pursuant to 35 U.S.C. § 119(e) to United States Provisional Patent Application Ser. No. 62/475,699 filed Mar. 23, 2017, which is incorporated herein by reference in its entirety.

FIELD

The present invention relates to α-Al₂O₃ coatings and, in particular, to α-Al₂O₃ coatings wherein texture is controlled via chemical vapor deposition parameters.

BACKGROUND

Alumina (Al₂O₃) in combination with TiCN deposited onto cemented carbide substrates is the most popular CVD coating system in cutting tool industry. State-of-the-art technique for Al₂O₃ deposition is chemical vapor deposition from a mixture of AlCl₃/H₂/CO₂ precursors, on top of the TiCN layer. A TiOCN bonding layer that exhibits elongated whiskers is applied between MT-TiCN and Al₂O₃ to ensure adhesion as well as provide a nucleation surface for proper nucleation of Al₂O₃. Typically, the deposition of Al₂O₃ consists of two steps, a nucleation step that controls the phase of Al₂O₃ coating, and a growth step in the presence of H₂5. It is well-known that H₂S can be used as a promoter to increase the growth rate of CVD Al₂O₃ and improve the thickness uniformity of the Al₂O₃ coating around edges. While H₂S has been extensively used as a catalyst in CVD process for cutting tool manufacturing, the nature of the catalytic mechanism is not well-understood. One theory is that H₂S shifts the rate determining step from the gas phase to the surface. In a recent theoretical study by Blomqvist et al., it was suggested that H₂S is kinetically and thermodynamically favored over H₂O at the AlO-surface, and it catalyzes the Al₂O₃ growth through the following scenario:

$$H_2S + Al_2O_3: Cl \rightarrow Al_2O_3: SH + HCl \quad (1)$$

$$H_2O + Al_2O_3: SH \rightarrow Al_2O_3: OH + H_2S \quad (2)$$

Recently, texture control of CVD Al₂O₃ has attracted increasing attention due to the anisotropic nature of Al₂O₃. The wear resistance and mechanical properties of α-Al₂O₃ can be substantially enhanced by choosing an optimized texture for various cutting conditions. The nucleation step is of crucial importance in pre-determining the growth texture of the Al₂O₃ layers. This has been shown in the work of Ruppi who successfully prepared Al₂O₃ with different textures by tuning oxidation potential of the furnace atmosphere in the nucleation steps. While no crystal orientation relationship between TiOCN bonding layer and Al₂O₃ layer has been reported, there is some evidence of epitaxial relationships between Al₂O₃ and certain types of titanium oxides. Growth step is another factor that has been demonstrated to influence the texture. It has been shown in various studies that texture can be modified by slightly adjusting the deposition process or doping.

SUMMARY

In one aspect, articles are described comprising wear resistant coatings employing alumina layers having texture gradients. Briefly, a coated article comprises a substrate and a coating adhered to the substrate, the coating comprising a layer of α-Al₂O₃ deposited by chemical vapor deposition (CVD), the α-Al₂O₃ layer comprising a gradient of two or more texture coefficients (TC) along thickness of the α-Al₂O₃ layer, wherein the texture coefficients of the gradient are selected from the (012), (104), (110), (006), (113), (202), (024) and (116) growth directions and defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection
I₀(hkl)=standard intensity of the (hkl) reflection according to International Center for Diffraction Data (ICDD) card 43-1484
n=number of reflections used in the TC calculation
(hkl) reflections used in the TC calculation are (012), (104), (110), (006), (113), (202), (024) and (116). In some embodiments, the gradient comprises a nucleation texture coefficient (TC) and a bulk texture coefficient (TC).

In another aspect, methods of controlling alumina texture are described. In some embodiments, a method of controlling Al₂O₃ texture comprises nucleating grains of α-Al₂O₃ from a reactant gas mixture in a chemical vapor deposition apparatus and altering texture of the nucleated grains from a first texture coefficient to a second texture coefficient via addition of H₂S to the reactant gas mixture, wherein the first and second texture coefficients are independently selected from the (012), (104), (110), (006), (113), (202), (024) and (116) growth directions and defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection
I₀(hkl)=standard intensity of the (hkl) reflection according to International Center for Diffraction Data (ICDD) card 43-1484
n=number of reflections used in the TC calculation
(hkl) reflections used in the TC calculation are (012), (104), (110), (006), (113), (202), (024) and (116).

In other embodiments, a method of controlling texture of an Al₂O₃ layer comprises providing a bonding layer comprising TiOCN and treating the bonding layer with a reactant gas mixture comprising two or more of CO₂, CO and N₂ and the balance H₂ prior to nucleation of α-Al₂O₃ grains These and other embodiments are described further in the detailed description which follows.

BRIEF DESCRIPTION OF THE DRAWINGS

FIGS. 3(A)-3(C) are inverse pole figure maps for the Al₂O₃ layers of coatings A1, B1 and C1 respectively.

DETAILED DESCRIPTION

Figure 1:
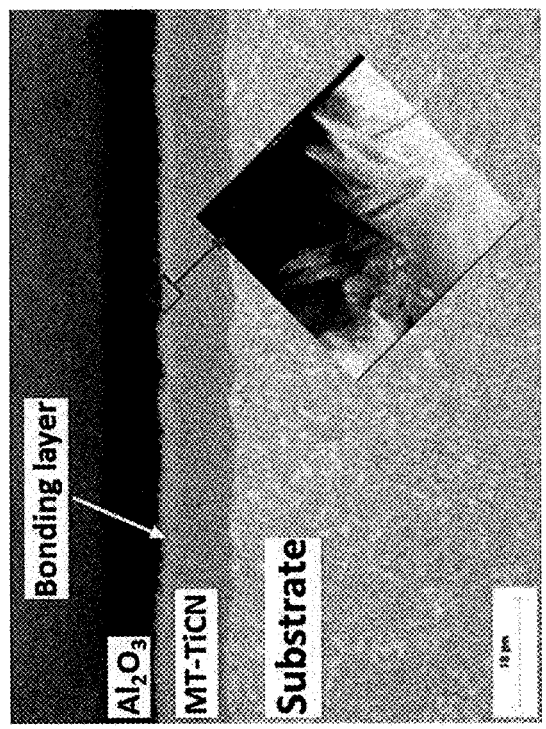
FIG. 1 is a cross-sectional microscopy image of a coating having an architecture described herein, wherein the insert is a scanning transmission electron microscopy (STEM) image of a TiOCN bonding layer with whisker-like structure.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention In one aspect, articles are described comprising wear resistant coatings employing alumina layers having texture gradients. A coated article comprises a substrate and a coating adhered to the substrate, the coating comprising a layer of α-Al$_2$O$_3$ deposited by chemical vapor deposition (CVD), the α-Al$_2$O$_3$ layer comprising a gradient of two or more texture coefficients (TC) along thickness of the α-Al$_2$O$_3$ layer, wherein the texture coefficients of the gradient are selected from the (012), (104), (110), (006), (113), (202), (024) and (116) growth directions and defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection
I$_o$(hkl)=standard intensity of the (hkl) reflection according to International Center for Diffraction Data (ICDD) card 43-1484
n=number of reflections used in the TC calculation
(hkl) reflections used in the TC calculation are (012), (104), (110), (006), (113), (202), (024) and (116).

In some embodiments, the gradient comprises a nucleation texture coefficient (TC) and a bulk texture coefficient (TC). The nucleation TC and bulk TC can have any value in any growth direction. In some embodiments, for example, the nucleation TC has a value greater than 5 in the (110) growth direction. Moreover, the bulk TC can have a value of greater than 3 in the (012) growth direction. Alternatively, the bulk TC can have a value greater than 4 in the (006) basal plane or (001) growth direction. The nucleation TC can extend into the α-Al$_2$O$_3$ layer any desired distance. In some embodiments, the nucleation TC extends into the α-Al$_2$O$_3$ layer a distance of up to 1 μm from the deposition surface. The deposition surface can be the substrate surface or the surface of a refractory layer on which the α-Al$_2$O$_3$ is deposited. For example, the nucleation TC can extend a distance of 10-500 nm from the deposition surface.

A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling or turning applications. Substrates of coated articles described herein can be formed of cemented carbide, carbide, ceramic, cermet, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

A cutting tool substrate can comprise one or more cutting edges formed at the juncture of a rake face and flank face(s) of the substrate.

EXAMPLES

The α-Al$_2$O$_3$ coatings described herein were deposited from H$_2$, AlCl$_3$, CO$_2$ and H$_2$S in a computer-controlled hot-wall reactor. The AlCl$_3$ was generated through the chlorination of aluminum pellet with HCl. All the α-Al$_2$O$_3$ coatings were deposited onto WC-Co substrates that have been pre-coated with ~7 μm of MT-TiCN and ~1 μm of TiOCN bonding layer (FIG. 1).

The surface microstructure was investigated using SEM JOEL-6800. X-ray diffraction (XRD) was performed on a PANalytical X'Pert equipment with Cu K$_\alpha$ radiation for TC determination.
Incidence Optics Included:
Long fine focus X-ray tube operating at 45 KV and 40 MA.
Variable divergence optic operating in automatic mode to insure constant irradiated sample surface area throughout the analysis.
Fixed antiscatter slit
Receiving Optics Included:
Variable Antiscatter slit operating in automatic mode to match the automatic divergence slit Multistrip solid state detector operating in scanning mode.
Scan parameters (speed and count time) are selected to ensure a minimum of ten data steps across the peak full width at half max (FWHM) and approximately 10,000 total counts on the most intense peak or to accumulate sufficient statistics. Collected data is first converted from variable slits mode (constant irradiated surface) to fixed slits mode (constant gauge volume) usable for analysis. This conversion is completed using the formula:

$$I_{FIX}(\theta, a) = I_{ADS}(\theta, L) \times \left( \frac{R \sin(a/2)}{L} \right) \times \left( \frac{1}{\sin(\theta + a/2)} + \frac{1}{\sin(\theta - a/2)} \right)$$

where R=radius of the goniometer (R=240 mm), α=the divergence angle (α=¼°) and L=the irradiated length on the sample (L=2 mm)

The corrected intensity is analyzed using peak finding software to identify the peak position of all peaks in the collected data. The peaks are then refined using a profile function to precisely identify the peak position and peak height. This peak data was used for TC determination.

Texture coefficients for α-$Al_2O_3$ were calculated from the following equation (3):

$$TC(hkl) = \frac{I(hkl)}{I_o(hkl)} \left\{ \frac{1}{n} \Sigma \frac{I(hkl)}{I_o(hkl)} \right\}^{-1}$$

where I(hkl) is the measured intensity of the (hkl) reflection, $I_o$(hkl) is the standard intensity of the (hkl) reflection according to International Center for Diffraction Data (ICDD) card 43-1484, and n is the number of reflections used in the TC calculation. 8 (hkl) reflections are used in this study: (012), (104), (110), (006), (113), (202), (024), and (116). Electron back-Scatter Diffraction (EBSD) was also used to investigate texture on coating cross section. All EBSD data were collected using an Oxford Nordlys Max detector incorporated in SEM. The coating surface were coated with TiN by physical vapor deposition to prevent charging. During the data collection, the samples were tilted to an angle of 70° and patterns were recorded at 30 kV. Orientation data were recorded at spatial intervals of 60 nm for Coating A1 and 40 nm for Coating B1. The data were processed and analyzed using Oxford's HKL analysis software.

To understand the influence of the growth condition on texture of α-$Al_2O_3$, 3 coatings were deposited from different process parameters on the same nucleation surfaces. All 3 deposition processes contain two steps, a nucleation step and a growth step. $H_2S$ were only added in the growth step to prevent sulfur poisoning of the nucleation surface. Deposition parameters were summarized in Table 1.

TABLE 1

Process parameters used to deposit $Al_2O_3$ layers A1-C1

|  | Coating A1 | | Coating B1 | | Coating C1 | |
| --- | --- | --- | --- | --- | --- | --- |
|  | Step 1 nucleation | Step 2 growth | Step 1 nucleation | Step 2 growth | Step 1 nucleation | Step 2 growth |
| Temperature (° C.) | 1000 | 1000 | 1000 | 1000 | 1000 | 1000 |
| Time (min) | 45 | 390 | 45 | 390 | 45 | 390 |
| Pressure (torr) | 60 | 60 | 60 | 60 | 60 | 60 |
| $H_2$ (vol %) | Balance | Balance | Balance | Balance | Balance | Balance |
| $N_2$ (vol %) | 3.70 | 0.00 | 8.88 | 0.00 | 0.00 | 0.00 |
| $CO_2$ (vol %) | 7.41 | 4.87 | 2.44 | 2.79 | 2.02 | 2.01 |
| $H_2S$ (vol %) | 0.00 | 0.24 | 0.00 | 0.24 | 0.00 | 0.42 |
| HCl (vol %) | 3.70 | 2.43 | 1.78 | 3.04 | 2.13 | 2.12 |
| $AlCl_3$ (vol %) | 1.48 | 0.97 | 1.92 | 1.62 | 3.41 | 3.39 |

Figure 2A:
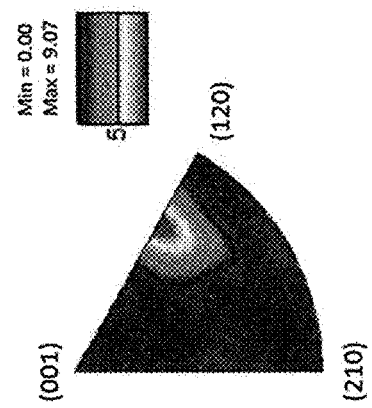
FIGS. 2(A)-2(C) are inverse pole figures with reference to growth direction for α-Al₂O₃ layers according to some embodiments.
Figure 2B:
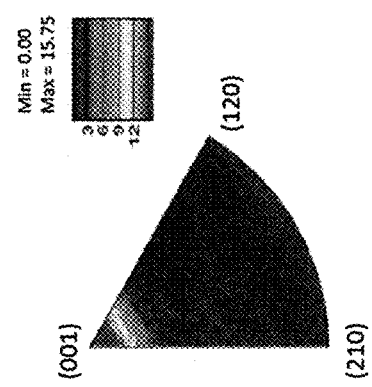
Figure 2C:
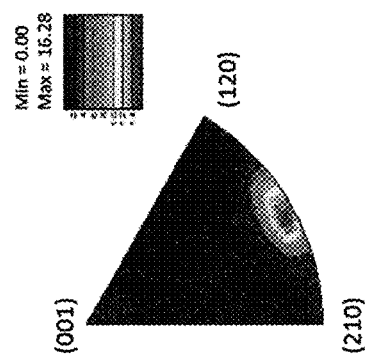

All the alumina layers were pure α-$Al_2O_3$ base on XRD. Texture coefficients for these 3 coatings are presented in Table 2. Coatings A1-C1 showed preferred orientation characterized by a texture coefficient TC>4.5 for the (012), (006) and (110) growth direction respectively. Inverse pole figures for the $Al_2O_3$ layers for the coatings A1-C1 are shown in FIG. 2. Each inverse pole figure was plotted with reference to the growth direction. Consistent with XRD measurement, Coating A1 was textured in the (012) growth direction, Coating B1 was textured in (006) growth direction, and Coating C1 was textured in the (110) growth direction.

TABLE 2

Texture coefficients for Coating A1-C1

| (hkl) | (012) | (104) | (110) | (006) | (113) | (202) | (024) | (116) |
| --- | --- | --- | --- | --- | --- | --- | --- | --- |
| Coating A1 | 4.82 | 0.04 | 0.54 | 0.00 | 0.28 | 0.00 | 2.24 | 0.09 |
| Coating B1 | 0.79 | 0.64 | 1.17 | 4.56 | 0.12 | 0.00 | 0.43 | 0.29 |
| Coating C1 | 0.26 | 0.06 | 5.24 | 2.25 | 0.06 | 0.00 | 0.11 | 0.02 |

Inverse pole figure maps for the $Al_2O_3$ layers for coating A1 and B1 are shown in FIG. 3 The growth direction of the coating is vertical. The grain shades correspond to the orientations defined in the shading key. Both Coatings A1 and B1 show two distinct zones in the α-$Al_2O_3$ layer, a fine-grained bottom zone which is about 1 μm thick from nucleation surface, and a top zone form the bulk of the α-$Al_2O_3$ layer and consists of larger grains with higher aspect ratio.

Within the bulk of the $Al_2O_3$ layers, the texture is consistent with XRD measurements. However, it is interesting that in both of the coatings (A1, B1), the bottom zone exhibits distinct texture from the bulk, both indexed as (110). It should to be noted that it is not possible to detect grains with diameters smaller than ~200 nm, so some the bottom fine grained area appear black. In FIG. 3, grains that have a crystal direction within 20° of deviation from [110] with reference to the coating growth direction were highlighted. It is clear that the presence of (110) texture was restricted to the bottom zone of the coating, directly on the nucleation surface. Notably, Coating C1 did not exhibit a texture gradient as in Coatings A1 and B1.

The results presented herein suggest that at the early stage in the deposition, in spite of different sets of deposition parameters being used, both $Al_2O_3$ coatings exhibit essentially the same texture. And different bulk textures can be developed later during coating growth. Since the $Al_2O_3$ coatings were deposited in a two-steps process and $H_2S$ is only added in the second step, we suggest that this effect is caused by the addition of $H_2S$ in the growth step. Without $H_2S$, texture of CVD α-$Al_2O_3$ is not sensitive to process parameters and is mainly controlled by the condition of nucleation surface.

Effect of $H_2S$

To confirm that $H_2S$ is a prerequisite for controlling texture of $Al_2O_3$ by modifying reactant composition, Coatings A2-C2 were prepared using the same process parameters for A1-C1 respectively, but without the addition of $H_2S$ in the second step (Table 3). Without the promoting effect of $H_2S$ on growth rate, coating A2-C2 are significantly thinner than A1-C1, the thickness for coating A2-C2 are ~2 μm. XRD confirmed a very strong (110) texture in all of the samples. Texture coefficients for these 3 coatings are shown in Table 4.

TABLE 3

Process parameters used to deposit $Al_2O_3$ layers A2-C2

|  | Coating A2 | | Coating B2 | | Coating C2 | |
| --- | --- | --- | --- | --- | --- | --- |
|  | Step 1 nucleation | Step 2 growth | Step 1 nucleation | Step 2 growth | Step 1 nucleation | Step 2 growth |
| Temperature (° C.) | 1000 | 1000 | 1000 | 1000 | 1000 | 1000 |
| Time (min) | 45 | 390 | 45 | 390 | 45 | 390 |
| Pressure (torr) | 60 | 60 | 60 | 60 | 60 | 60 |
| $H_2$ (vol %) | Balance | Balance | Balance | Balance | Balance | Balance |
| $N_2$ (vol %) | 3.70 | 0.00 | 8.88 | 0.00 | 0.00 | 0.00 |
| $CO_2$ (vol %) | 7.41 | 4.87 | 2.44 | 2.79 | 2.02 | 2.01 |
| $H_2S$ (vol %) | 0.00 | 0.00 | 0.00 | 0.00 | 0.00 | 0.00 |
| HCl (vol %) | 3.70 | 2.43 | 1.78 | 3.04 | 2.13 | 2.12 |
| $AlCl_3$ (vol %) | 1.48 | 0.97 | 1.92 | 1.62 | 3.41 | 3.39 |

TABLE 4

Texture coefficients for Coating A2-C2

| hkl | (012) | (104) | (110) | (006) | (113) | (202) | (024) | (116) |
| --- | --- | --- | --- | --- | --- | --- | --- | --- |
| Coating A2 | 0.30 | 0.08 | 7.35 | 0.07 | 0.08 | 0.00 | 0.11 | 0.01 |
| Coating B2 | 0.39 | 0.04 | 6.92 | 0.00 | 0.15 | 0.36 | 0.14 | 0.02 |
| Coating C2 | 0.24 | 0.02 | 7.54 | 0.00 | 0.11 | 0.00 | 0.09 | 0.01 |

Figure 4:
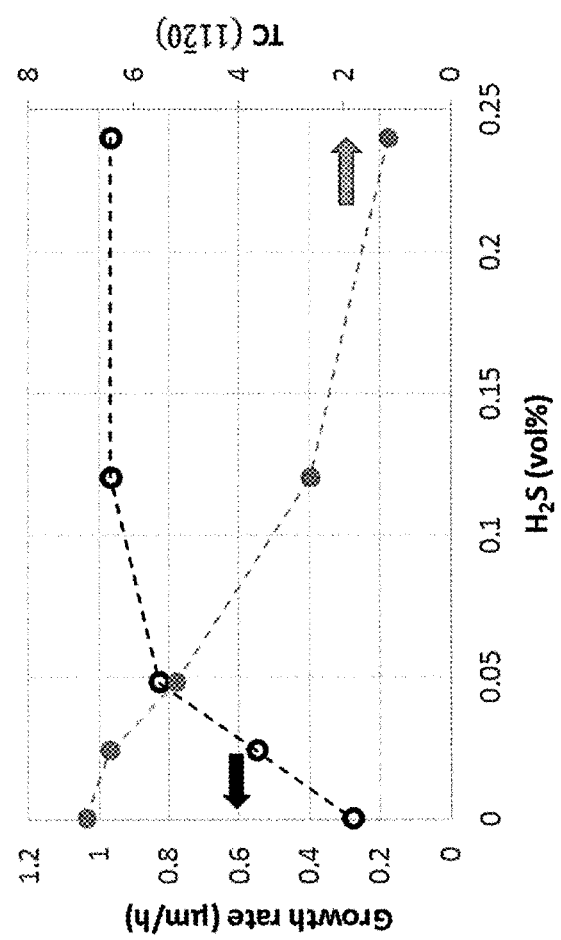
FIG. 4 illustrates CVD α-Al₂O₃ growth rate and TC (110) as a function of H₂S concentration in the gaseous feed.

To develop additional insights into the role of $H_2S$ in texture control of CVD α-$Al_2O_3$, the effect of $H_2S$ concentration in the deposition process was also examined. In this test, we used the same process parameters for coating B1 (Table 1) except the concentration of $H_2S$ in the growth step varies for each coating. Coating thickness and texture coefficient were summarized in Table 5. Again, the catalytic effect of $H_2S$ is clear. The growth rate of $Al_2O_3$ increases with increasing $H_2S$ level and reach a rate plateau at 0.048% of $H_2S$ (FIG. 4).

TABLE 5

The influence of $H_2S$ level on α-$Al_2O_3$ coating thickness and texture coefficients

| | $H_2S$ | Coating | Texture coefficient | | | | | | | |
| --- | --- | --- | --- | --- | --- | --- | --- | --- | --- | --- |
| | (vol %) | thickness | (012) | (104) | (110) | (006) | (113) | (202) | (024) | (116) |
| B1 | 0.24 | ~7 μm | 0.79 | 0.64 | 1.17 | 4.56 | 0.12 | 0.00 | 0.43 | 0.29 |
| B3 | 0.12 | ~7 μm | 3.48 | 0.02 | 2.64 | 0.00 | 0.22 | 0.09 | 1.49 | 0.05 |
| B4 | 0.048 | ~6 μm | 1.74 | 0.03 | 5.19 | 0.00 | 0.26 | 0.00 | 0.75 | 0.04 |
| B5 | 0.024 | ~4 μm | 0.45 | 0.03 | 6.48 | 0.00 | 0.26 | 0.58 | 0.18 | 0.02 |
| B2 | 0 (B2) | ~2 μm | 0.39 | 0.04 | 6.92 | 0.00 | 0.15 | 0.36 | 0.14 | 0.02 |

Figure 5:
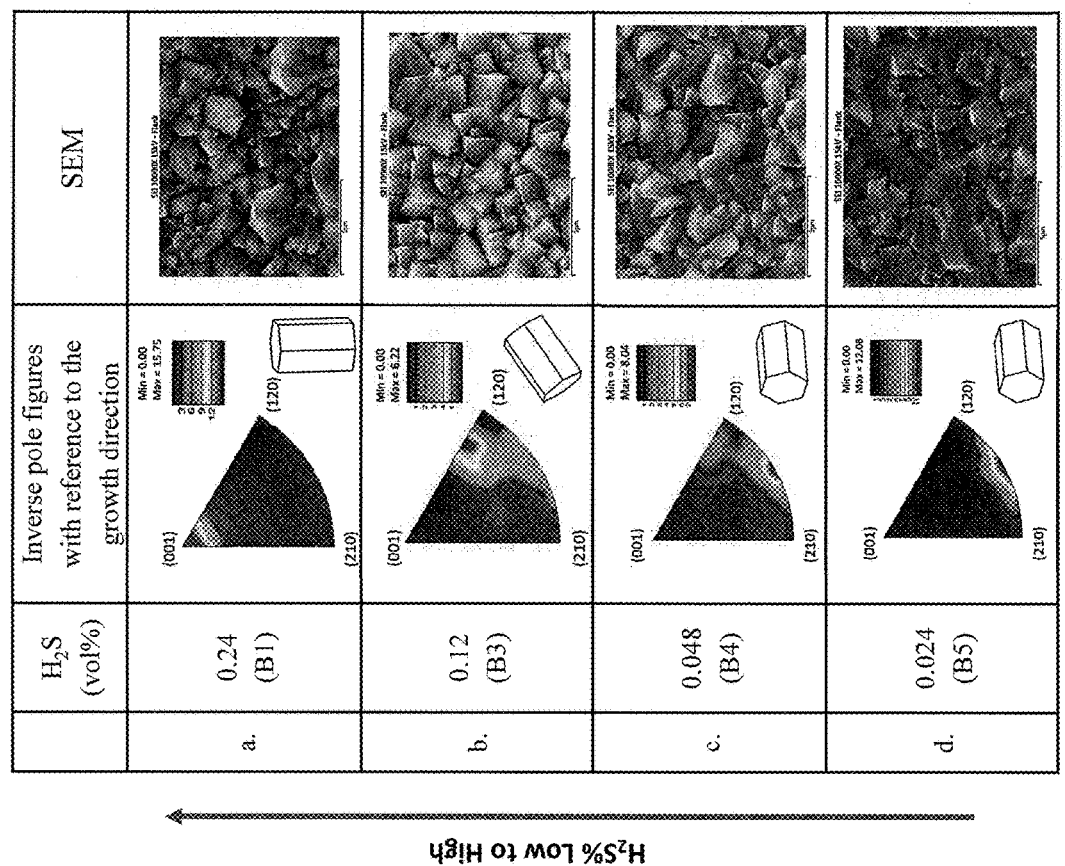
FIG. 5 illustrates crystallographic and microstructural differences between α-Al$_2$O$_3$ layers as a function of H$_2$S content of the reactant gas mixture according to some embodiments.

The influence of $H_2S$ on texture coefficient is more interesting. At very low concentration of $H_2S$ (<0.024%), the effect on texture is minimal. The (006) plane of $Al_2O_3$ in coating B2 and B5 are primarily aligned perpendicular to the coating surface. As we increase the amount of $H_2S$, the intensity of (110) reflection decreased significantly (FIG. 4). Coating B3 exhibit a weak texture of (012) and (110), indicates that part of the α-$Al_2O_3$ grains in B3 have the (001) plane of $Al_2O_3$ inclined to the coating surface by about 58°, and others are nearly perpendicular to the coating surface. In coating B1, most of the (001) planes are nearly parallel to the coating surface. Surface SEM confirmed markedly different microstructure in these coatings (FIG. 5). Differences in microstructure were also confirmed by the inverse pole figures provided in FIG. 5.

It is surprising that $H_2S$ has such a strong impact on α-$Al_2O_3$ texture with fairly small changes in the concentration. Increasing $H_2S$ from 0.048% to 0.24% in the reactant flow is enough to alter the crystal direction of α-$Al_2O_3$ by 90°. It can be rule out the possibility that this observation is caused by different coating thickness since coating B1, B3 and B4 have essentially the same thickness, but quite different textures. We suggest that $H_2S$ affect the texture of α-$Al_2O_3$ through a strong interaction on the $Al_2O_3$ surface. $H_2S$ has been found to adsorbed dissociatively, and preferably on the (110) surface planes of γ-$Al_2O_3$. Here we propose that a similar type of interaction may exist between $H_2S$ and α-$Al_2O_3$. Different sorption properties of $H_2S$ on different α-$Al_2O_3$ surface planes leads to the formation of various intermediate configuration under different deposition conditions, which in turn results in different textures.

Effect of Nucleation Surface

Finally, the impact of nucleation surface on texture was examined. It was previously demonstrated that the growth textures of $Al_2O_3$ coatings could be manipulated by different nucleation procedures. In this study, we are particularly interested in surface condition of the bonding layer before nucleation starts. Therefore, coating B1 (Table 1) was repeated on three different nucleation surfaces. The bonding layer underlying the $Al_2O_3$ coating were deposited from same recipes, the only difference is that in sample Mod-1 and Mod-2, we treated the surface of the bonding layer with a mixture of $CO_2/CO/N_2/H_2$ followed by a short Ar purge to tune the surface condition before the nucleation of $Al_2O_3$ starts. Our results demonstrate that nucleation surface is of great importance in pre-determining the texture of α-$Al_2O_3$ (Table 6). This finding also presents a simple method to tune the texture of α-Al$_2$O$_3$ from one to another by only modifying the nucleation surface.

TABLE 6

The influence of nucleation surface condition on α-Al$_2$O$_3$ texture. The pretreatment condition for Mod-1 is 1% CO$_2$ balanced in H$_2$, for Mod-2 is 2% CO$_2$, 1% CO, and 40% N$_2$ balanced in H$_2$.

| Nucleation surface | Coating | (012) | (104) | (110) | (006) | (113) | (202) | (024) | (116) |
|---|---|---|---|---|---|---|---|---|---|
| Standard | Coating | 0.79 | 0.64 | 1.17 | 4.56 | 0.12 | 0.00 | 0.43 | 0.29 |
| Mod-1 | B1 | 1.58 | 0.66 | 0.94 | 3.22 | 0.31 | 0.16 | 0.76 | 0.38 |
| Mod-2 |  | 3.35 | 0.63 | 0.95 | 0.98 | 0.41 | 0.25 | 1.13 | 0.29 |

Texture control of α-Al$_2$O$_3$ is a complex function of nucleation surface and process parameters. In this study, we have demonstrated that the nucleation surface has a key role in pre-determine the texture, while texture can also be altered by adjusting growth condition in the presence of H$_2$S. Without H$_2$S, reactant composition has minimal impact on Al$_2$O$_3$ texture.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
a substrate; and
a coating adhered to the substrate, the coating comprising a layer of α-Al$_2$O$_3$ deposited by chemical vapor deposition (CVD), the α-Al$_2$O$_3$ layer comprising a gradient of two or more texture coefficients (TC) along thickness of the α-Al$_2$O$_3$ layer, wherein the texture coefficients of the gradient are selected from the (012), (104), (110), (006), (113), (202), (024) and (116) growth directions and defined as:

$$TC(hkl) = \frac{I(hkl)}{I_o(hkl)}\left\{\frac{1}{n}\Sigma\frac{I(hkl)}{I_o(hkl)}\right\}^{-1}$$

where
I(hkl)=measured intensity of the (hkl) reflection
I$_o$(hkl)=standard intensity of the (hkl) reflection according to International Center for Diffraction Data (ICDD) card 43-1484
n=number of reflections used in the TC calculation
(hkl) reflections used in the TC calculation are (012), (104), (110), (006), (113), (202), (024) and (116),
wherein the gradient comprises a nucleation TC in the (110) growth direction and a bulk TC.

2. The coated article of claim 1, wherein the nucleation TC has a value greater than 5 in the (110) growth direction.

3. The coated article of claim 2, wherein the bulk TC has a value greater than 3 in the (012) growth direction.

4. The coated article of claim 2, wherein the bulk TC has a value greater than 4 in the (006) growth direction.

5. The coated article of claim 1, wherein the nucleation TC extends into the α-Al$_2$O$_3$ layer a distance of up to 1 μm from a surface on which the α-Al$_2$O$_3$ layer is deposited.

6. The coated article of claim 1, wherein the nucleation TC extends into the α-Al$_2$O$_3$ layer a distance of 50-500 nm from a surface on which the α-Al$_2$O$_3$ layer is deposited.

7. The coated article of claim 1, wherein growth directions of the nucleation TC and bulk TC are offset by at least 45 degrees.

8. The coated article of claim 1, wherein growth directions of the nucleation TC and bulk TC are offset by 90 degrees.

9. A coated article comprising:
a substrate; and
a coating adhered to the substrate, the coating comprising a layer of α-Al$_2$O$_3$ deposited by chemical vapor deposition (CVD), the α-Al$_2$O$_3$ layer comprising a gradient of two or more texture coefficients (TC) along thickness of the α-Al$_2$O$_3$ layer, wherein the texture coefficients of the gradient are selected from the (012), (104), (110), (006), (113), (202), (024) and (116) growth directions and defined as:

$$TC(hkl) = \frac{I(hkl)}{I_o(hkl)}\left\{\frac{1}{n}\Sigma\frac{I(hkl)}{I_o(hkl)}\right\}^{-1}$$

where
I(hkl)=measured intensity of the (hkl) reflection
I$_o$(hkl)=standard intensity of the (hkl) reflection according to International Center for Diffraction Data (ICDD) card 43-1484
n=number of reflections used in the TC calculation
(hkl) reflections used in the TC calculation are (012), (104), (110), (006), (113), (202), (024) and (116),
wherein the layer of α-Al$_2$O$_3$ has a grain size gradient between a nucleation zone and a bulk zone, the bulk zone having larger grains with higher aspect ratio relative to grains of the nucleation zone.

10. The coated article of claim 9, wherein the gradient comprises a nucleation TC and a bulk TC.

11. The coated article of claim 10, wherein the nucleation TC is in the (110) growth direction.

12. The coated article of claim 11, wherein the bulk TC is in the (006) growth direction.

13. The coated article of claim 11, wherein the bulk TC is in the (012) growth direction.

14. The coated article of claim 10, wherein growth directions of the nucleation TC and bulk TC are offset by at least 45 degrees.

15. The coated article of claim 10, wherein growth directions of the nucleation TC and bulk TC are offset by 90 degrees.

* * * * *